United States Patent [19]

Geary et al.

[11] 4,259,728

[45] Mar. 31, 1981

[54] FERROELECTRIC ANALOG DEVICE

[75] Inventors: John M. Geary, Summit; Hans G. Mattes, Ocean Township, Monmouth County, N.J.

[73] Assignee: Bell Telephone Laboratories, Incorporated, Murray Hill, N.J.

[21] Appl. No.: 27,612

[22] Filed: Apr. 5, 1979

[51] Int. Cl.³ .................. G11C 27/00; G11C 11/22
[52] U.S. Cl. ......................... 365/45; 365/145; 365/157; 369/126; 369/93
[58] Field of Search ............ 365/45, 94, 102, 145, 365/157; 179/100.1 B

[56] References Cited

U.S. PATENT DOCUMENTS

| | | | |
|---|---|---|---|
| 1,580,112 | 4/1926 | Bone | 179/100.1 B |
| 1,715,863 | 6/1929 | Pomeroy | 179/100.1 B |
| 3,142,044 | 7/1964 | Kaufman et al. | 365/145 |
| 3,508,222 | 4/1970 | Bobeck | |
| 3,701,122 | 10/1972 | Geusic et al. | 365/117 |
| 3,701,147 | 10/1972 | Whitehouse | 365/157 |
| 3,936,146 | 2/1976 | Kumada et al. | 350/149 |
| 3,953,109 | 4/1976 | Kumada | 350/160 R |

OTHER PUBLICATIONS

Jacobs et al., Ferroelectric Devices, IBM Tech. Disc. Bul., vol. 15, No. 8, 1/73, pp. 2403-2404.

*Primary Examiner*—Stuart N. Hecker
*Attorney, Agent, or Firm*—Peter A. Businger

[57] ABSTRACT

Analog readout devices are disclosed which utilize domain wall motion in a film of ferroelectric material to produce an electrical signal having a desired waveform. Disclosed devices comprise electrodes disposed on facing sides of the film, at least one electrode being patterned in correspondence with the desired waveform. Readout from devices may be direct or as the difference between two signals produced by domain wall motion. In the latter case, constant-width pairs of electrodes may be used in combination with a feedback circuit to ensure constant-velocity ferroelectric wall motion.

5 Claims, 3 Drawing Figures

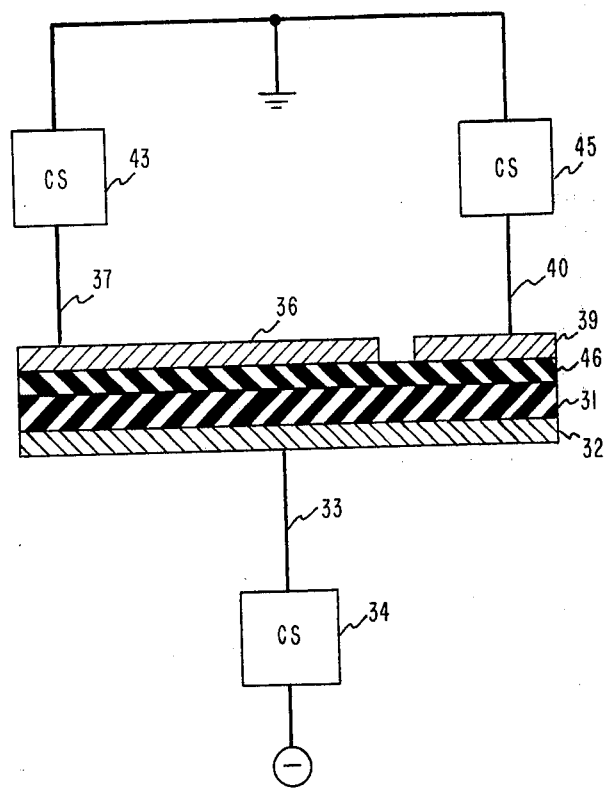

FERROELECTRIC ANALOG DEVICE

CROSS-REFERENCE TO RELATED APPLICATIONS

Concurrently filed are applications Ser. No. 027,611 and Ser. No. 027,613.

TECHNICAL FIELD

The invention is concerned with the use of ferroelectric materials for readout of stored analog signals.

BACKGROUND OF THE INVENTION

Analog signal storage and readout have a variety of uses and are accomplished by a variety of means as exemplified by phonographic and magnetic tape recording and playback devices. Typically, output from readout devices is in the form of an electrical signal which may be used, e.g., to drive a loudspeaker or an optical display device.

While phonographic and magnetic tape devices are commercially well established, alternate technologies have been developed for specialized applications. For example, U.S. Pat. No. 3,508,222 (issued Apr. 21, 1970 in the name of A. H. Bobeck) discloses a device for analog signal storage and readout utilizing patterned electrodes which are deposited on a sheet of magnetic material.

In the context of the invention, a class of materials is relevant which in some respects is similar to the class of magnetic materials. Members of this class, known as ferroelectric materials, exhibit electric polarization in two preferred antiparallel directions and permit the simultaneous presence of regions of either polarization. Furthermore, some such materials have different optical properties associated with the two polarization states, a feature which has been utilized in various electro-optical devices. For example, U.S. Pat. Nos. 3,953,109 (issued Apr. 27, 1976 in the name of A. Kumada) and 3,936,146 (issued Feb. 3, 1976 in the names of A. Kumada et al) disclose devices in which a ferroelectric material is used for light control. Optical properties of ferroelectric materials are also utilized as disclosed in U.S. Pat. No. 3,701,122 (issued Oct. 24, 1972 in the names of J. E. Geusic et al) for readout of digital shift registers in which digital data are represented by ferroelectric domains.

While readout from digital ferroelectric devices has been demonstrated in principle, analog signal storage and readout have remained unexplored.

SUMMARY OF THE INVENTION

A desired waveform is represented by suitably shaped electrodes on a film of a ferroelectric material. The invention provides for readout of a current signal which represents the waveform and which is obtained by scanning wall motion in the ferroelectric material. Such current signal may be obtained from a single electrode or as the difference between currents from two electrodes which preferably have constant combined width which is defined as the sum of the widths of the two electrodes at any point along the length of the electrodes.

BRIEF DESCRIPTION OF THE DRAWING

FIG. 3 shows schematically and in cross section a ferroelectric readout device comprising a resistive layer.

DETAILED DESCRIPTION

Devices of the invention comprise a ferroelectric material which permits two preferred electrical polarization states. The ferroelectric material may be, e.g., in the form of a single-crystal, self-supporting film or slab, a membrane supported at its edges, or a layer or film deposited on a substrate. Unless specifically differentiated in the following, such forms are understood to be interchangeable in the context of the invention. For the sake of convenience, such forms are collectively designated by the term "film". Directions of preferred electrical polarization are arranged to be generally perpendicular to the broad faces of such film. The device further comprises electrodes which may be conveniently attached to or deposited on the broad faces of the film of ferroelectric material.

Devices of the invention permit the simultaneous presence of regions or domains of either polarization in the ferroelectric material, domains of opposite polarization being separated by a domain wall which is generally parallel to the preferred polarization directions and generally perpendicular to the faces of the film. A domain expands in the presence of an electric field having a component which is parallel to the polarization of a domain; conversely, a domain contracts in the presence of a field having a component which is antiparallel to the polarization of the domain. For the sake of ease of description, ferroelectric films in the following are depicted horizontal and having upward and downward polarized domains.

Figure 1:
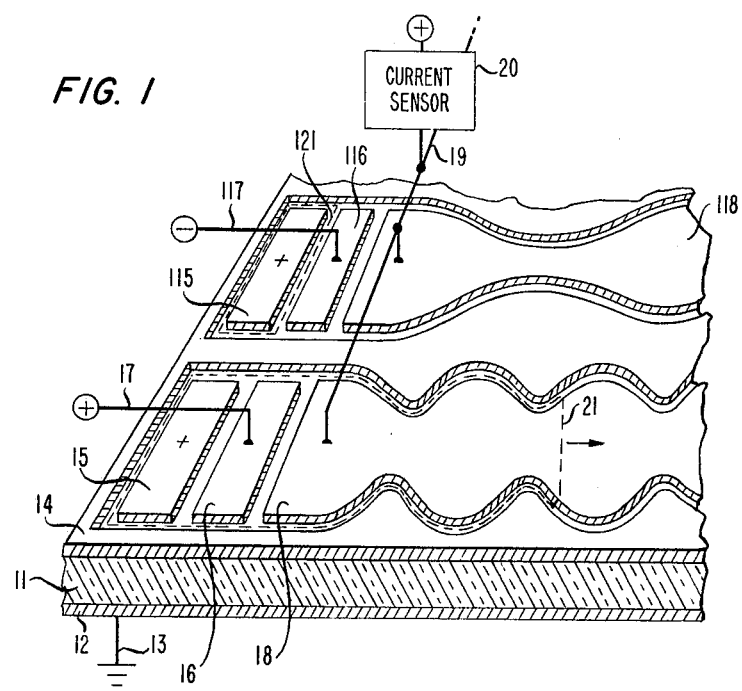
FIG. 1 shows schematically and greatly enlarged an analog ferroelectric readout device.

As a domain expands or contracts in response to a voltage applied to electrodes, a current flows in leads to the electrodes. Specifically, if electrodes are in intimate contact with facing sides of a ferroelectric film, and if a ferroelectric domain wall passes between the electrodes, a current is induced in the amount $$I = 2P_s \, dS/dt,$$

where $P_s$ denotes spontaneous polarization and $S$ is the area of the upward polarized domain between electrodes. Consequently, current is proportional to the rate at which electrode area is swept out by an advancing domain wall. If an advancing domain wall is essentially straight and perpendicular to the direction of advance, area increment is represented by the product of local electrode width and increment of forward motion. Consequently, if wall velocity is constant, current is proportional to local electrode width. A specific device having multiple analog signal readout tracks is shown in FIG. 1. Shown are ferroelectric film 11, ground electrode 12, ground lead 13, confiner electrode 14, origin electrodes 15 and 115, trigger electrodes 16 and 116, trigger leads 17 and 117, detector electrodes 18 and 118, common detector lead 19, current sensor 20, and outlines of downward polarized domains 21 and 121. While domain 121 associated with a second readout track is confined to the area of origin electrode 115, domain 21 is in the process of expanding along a first readout track and thereby causing a current signal in sensor 20 corresponding to the shape of electrode 18. Readout of a waveform is initiated by applying a positive voltage to one trigger electrode 16 or 116, respectively, as well as to common detector lead 19. As a result, the domain originally underlying origin electrodes 15 or 115 expands past trigger electrode 16 or 116, respectively, and scans the length of the detector electrode causing a current signal sensed by sensor 20. Instead of a single trigger electrode per readout track, a plurality of trigger electrodes may be utilized in series or in parallel to allow for triggering of the device conventional on more elaborate conditions.

The device shown in FIG. 1 utilizes a ferroelectric material in which domain walls may assume arbitrary shape. However, domains are restricted to an area delineated by a confiner electrode 14 which produces an opposing electrical field. Width of the detector electrode at the point of the passing domain wall determines current sensed by sensor 20. Specifically, if an advancing domain wall is straight and perpendicular to its direction of advance, and if velocity of advance is constant, time variation of the output current is directly proportional to the variation of the area of the detector electrode. Equivalently, variation of output current is proportional to variation of width of the detector electrode. In a ferroelectric film having uniform properties and, in particular, having constant thickness, constancy of advance velocity is obtained when a constant voltage is applied to detector electrode 18 or 118. To compensate for slow variations in film properties such as, e.g., film thickness, a feedback circuit in combination with a low-pass filter may be employed in practice to control the detector supply voltage so as to maintain average detector current at a desired fixed level. Use of a low-pass filter minimizes wall velocity fluctuations due to undesirable low frequency variations in film properties without significantly interfering with readout of a desired high frequency signal.

While it is desirable that an advancing domain wall be straight, it is possible to compensate for distortion caused by deviation from such desirable shape. Specifically, signal distortion may be prevented by suitable modification of electrode shape.

Figure 2:
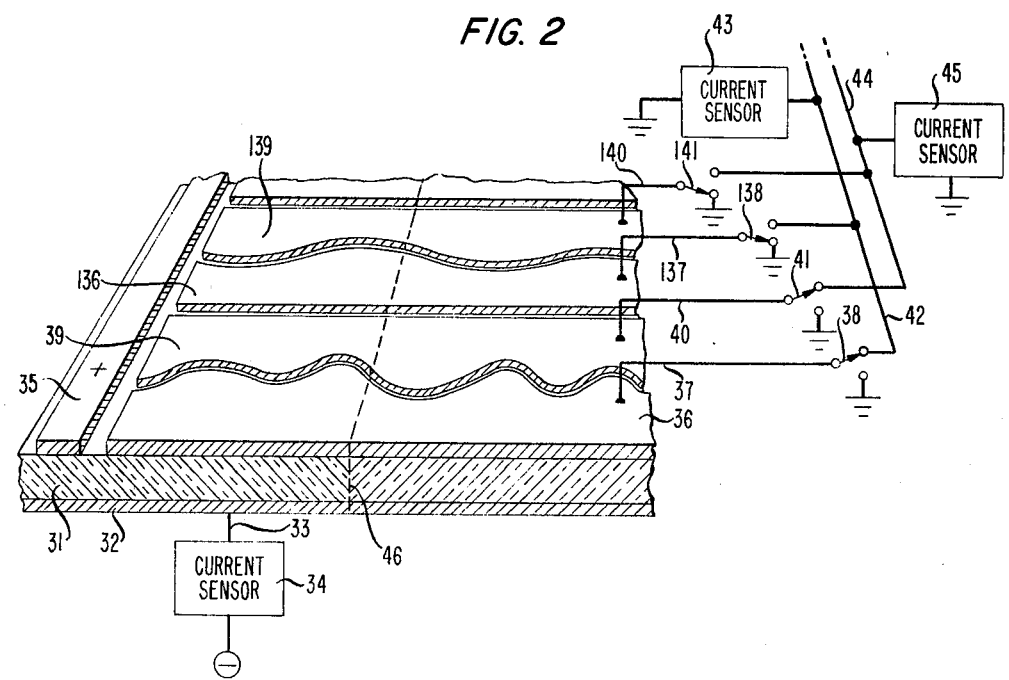
FIG. 2 shows schematically and greatly enlarged an alternate analog ferroelectric readout device utilizing readout from two electrodes having constant combined width.

FIG. 2 shows an alternate device for producing any one of several analog waveforms. Specifically shown are ferroelectric film 31, electrode 32, lead 33 with current sensor 34, origin electrode 35, detector electrodes 36 and 39 of a first readout track, leads 37 and 40, switches 38 and 41, lead 42 with current sensor 43, lead 44 with current sensor 45, detector electrodes 136 and 139 of a second readout track, leads 137 and 140, and switches 138 and 141. In contrast to ferroelectric film 11, ferroelectric film 31 only permits straight domain walls extending to the edges of the ferroelectric film. As a consequence of such limited domain shape, neither confiner nor trigger electrodes are shown in FIG. 2.

Another difference (unrelated to presence or absence of freedom of domain shape) between devices of FIG. 1 and FIG. 2 lies in the use of pairs of detector electrodes in the device of FIG. 2. When such an electrode pair is used, a desired waveform is advantageously represented by the difference of currents sensed by sensors 43 and 45, such difference being proportional to the deviation of the curve defined by the gap between detector electrodes from the median of the track defined by such electrodes. If the combined width of an electrode pair is constant, wall velocity is directly proportional to the sum of currents; consequently, such sum of currents may be conveniently used by a feedback system to control wall velocity by varying applied voltage. Alternately, if several readout tracks are implemented side-by-side as shown in FIG. 2, combined current as sensed by current sensor 34 may be used to control wall velocity. Switches 38, 41, 138, and 141 permit selection of a readout track by connecting, e.g., electrodes 36 and 39 to current sensors 43 and 45, respectively, while electrodes 136 and 139 are grounded to permit current flow as a domain wall passes.

A further beneficial feature which may be incorporated in the device consists of a resistive layer intermediate to a ferroelectric film and electrodes on the film and extending across the gap between electrodes. Alternatively, such layer may be present merely in interelectrode gaps. In either case, presence of the resistive layer facilitates movement of a ferroelectric domain wall in an inter-electrode gap on account of compensation of inter-electrode surface charge. Resistive layer material is preferably chosen sufficiently conductive to allow for rapid movement as well as sufficiently resistive to prevent undue power dissipation between electrodes. Similar benefits may be realized by doping the surface of the ferroelectric material, so as to impart slight conductivity to a surface region either before or after deposition of electrodes. Alternately, such purpose may be realized by rendering the ferroelectric material more conductive in bulk.

Use of a resistive layer is illustrated by FIG. 3 which shows ferroelectric film 31, electrode 32, lead 33 with current sensor 34, detector electrodes 36 and 39, leads 37 and 40, current sensors 43 and 45, and which additionally shows resistive layer 46.

Among ferroelectric materials suitable for the implementation of devices according to the invention are gadolinium molybdate, $Gd_2(MoO_4)_3$, and lead germanate, $Pb_5Ge_3O_{11}$. While the former material allows only planar domain walls which extend to the crystal boundary, the latter allows domain wall shape to be determined by electrode geometry. Both materials have desirably high Curie temperature, and gadolinium molybdate further has the desirable property of being highly resistant to spontaneous nucleation (a property which may also be realizable in lead germanate).

EXAMPLE

From a Czochralski-grown gadolinium molybdate boule, a rectangular c-axis plate is cut having edges in (110) and (1̄10) planes. The plate is polished and then annealed for 1 hour at a temperature of approximately 400 degrees C. to enhance domain wall mobility. A single domain wall traversing the narrow dimension of the plate is produced by physically stressing the plate while it is immersed in a slightly conductive liquid. Top and bottom faces are metallized by sequential vacuum deposition of a 100 Angstrom Cr layer, a 1000 Angstrom Al layer and a 100 Angstrom Ti layer, gaps between origin and detector electrodes being produced by scribing.

The detector electrode is further scribed with a waveform by means of a diamond stylus which is attached to an electromechanical transducer. The device is dipped in a Cr-Al etch to remove residual metal from the scribed trace. Detector electrode dimensions of 0.2 mm by 18 mm are convenient for a readout having a duration of 2 seconds.

We claim:

1. Device comprising a film which is ferroelectric, a first electrode on at least a portion of a first side of said film, a second electrode on at least a portion of a second side of said film and at least in part facing said first electrode characterized in that (1) at least said first electrode is patterned so as to have width which varies in correspondence to an analog signal and (2) a current sensor is electrically connected to at least one of said first electrode and said second electrode, whereby, upon movement of a ferroelectric domain wall in said film past said patterned electrode, a current signal is sensed whose strength is in correspondence to said signal.

2. Device of claim 1 comprising a third electrode on said first side, said first and said third electrodes being separated by a narrow gap having essentially constant width, the sum of the widths of said first and said third electrodes being essentially constant, and current sensors being electrically connected to said first and said third electrodes.

3. Device of claim 2 in which a current sensor is electrically connected to said second electrode.

4. Device of claim 2 in which a nonferroelectric layer having substantially greater resistivity than said first electrode and said third electrode and having substantially less resistivity than said film is between said film and said first and third electrodes and extending through said gap.

5. Device of claim 2 in which said film is doped at least at its surface so as to reduce resistivity to a value which is substantially greater than the resistivity of said first and third electrodes.

* * * * *

UNITED STATES PATENT AND TRADEMARK OFFICE
CERTIFICATE OF CORRECTION

PATENT NO. : 4,259,728
DATED : March 31, 1981
INVENTOR(S) : John M. Geary and Hans G. Mattes It is certified that error appears in the above—identified patent and that said Letters Patent is hereby corrected as shown below:

Column 3, line 11, "conventional" should read --conditional--. Column 4, line 50, "and (110) planes" should read --and ($1\bar{1}0$) planes--.

Signed and Sealed this

Thirtieth Day of June 1981

[SEAL]

Attest:

RENE D. TEGTMEYER

*Attesting Officer*  *Acting Commissioner of Patents and Trademarks*